United States Patent

Koopman et al.

Patent Number: 5,992,729
Date of Patent: Nov. 30, 1999

[54] TACKING PROCESSES AND SYSTEMS FOR SOLDERING

[75] Inventors: Nicholas G. Koopman; Sundeep Nangalia, both of Raleigh, N.C.

[73] Assignee: MCNC, Research Triangle Park, N.C.

[21] Appl. No.: 08/724,910

[22] Filed: Oct. 2, 1996

[51] Int. Cl.[6] ............................... B23K 1/20; B23K 31/02
[52] U.S. Cl. ...................... 228/175; 228/180.22; 228/18; 228/6.2
[58] Field of Search ........................ 228/175, 18, 180.22, 228/6.2

[56] References Cited

U.S. PATENT DOCUMENTS

| | | | |
|---|---|---|---|
| 4,172,547 | 10/1979 | DelGrande | 228/121 |
| 4,921,157 | 5/1990 | Dishon et al. | 228/124 |
| 5,102,030 | 4/1992 | Tamashima et al. | 228/175 |
| 5,125,560 | 6/1992 | Degani et al. | 228/175 |
| 5,129,962 | 7/1992 | Gutierrez et al. | 148/23 |
| 5,177,134 | 1/1993 | Mullen, III et al. | 524/284 |
| 5,255,839 | 10/1993 | da Costa Alves et al. | 228/180.21 |
| 5,407,121 | 4/1995 | Koopman et al. | 228/206 |
| 5,435,481 | 7/1995 | Da Costa Alves et al. | 228/223 |
| 5,447,267 | 9/1995 | Sakai et al. | 228/175 |
| 5,499,754 | 3/1996 | Bobbio et al. | 228/42 |
| 5,499,756 | 3/1996 | Banerji et al. | 228/214 |
| 5,511,719 | 4/1996 | Miyake et al. | 228/180.22 |

FOREIGN PATENT DOCUMENTS

| | | |
|---|---|---|
| 0 59 5 343 A2 | 5/1994 | European Pat. Off. . |
| 195 33 171 | 9/1995 | Germany . |
| 54-125969 | 9/1979 | Japan . |
| 59-229278 | 10/1983 | Japan . |
| 60-108161 | 11/1983 | Japan . |
| 59-010468 | 1/1984 | Japan . |
| 60-184465 | 9/1985 | Japan . |
| 3062935 | 3/1991 | Japan . |
| 4269896 | 9/1992 | Japan . |
| 5-152378 | 6/1993 | Japan ............................ 228/180.22 |
| 5-190601 | 7/1993 | Japan ............................ 228/180.22 |

OTHER PUBLICATIONS

"Micro–Soldering Method for Die Bumping/Die Attach", Research Disclosure, Jun. 1991, p. 386.
"Ultrasonic Reflow Soldering," *Ultrasonics*, vol. 9, No. 2, Apr. 1971, pp. 67–68.

*Primary Examiner*—Samuel M. Heinrich
*Assistant Examiner*—Jeffrey T. Knapp
*Attorney, Agent, or Firm*—Alston & Bird LLP

[57] ABSTRACT

A first component is soldered to a second component by placing the first component on the second component with solder therebetween, then ultrasonically vibrating at least one of the first and second components to thereby tack the solder to at least one of the first and second components, and by reflowing the solder. Ultrasonic vibration of at least one of the first and second components to thereby tack the solder is preferably performed for less than one second. A component placer places the first component on the second component with solder therebetween. An ultrasonic vibrator ultrasonically vibrates at least one of the placed first and second components, to thereby tack the solder to at least one of the placed first and second components. A solder reflower reflows the tacked solder to thereby solder the first component to the second component.

27 Claims, 6 Drawing Sheets

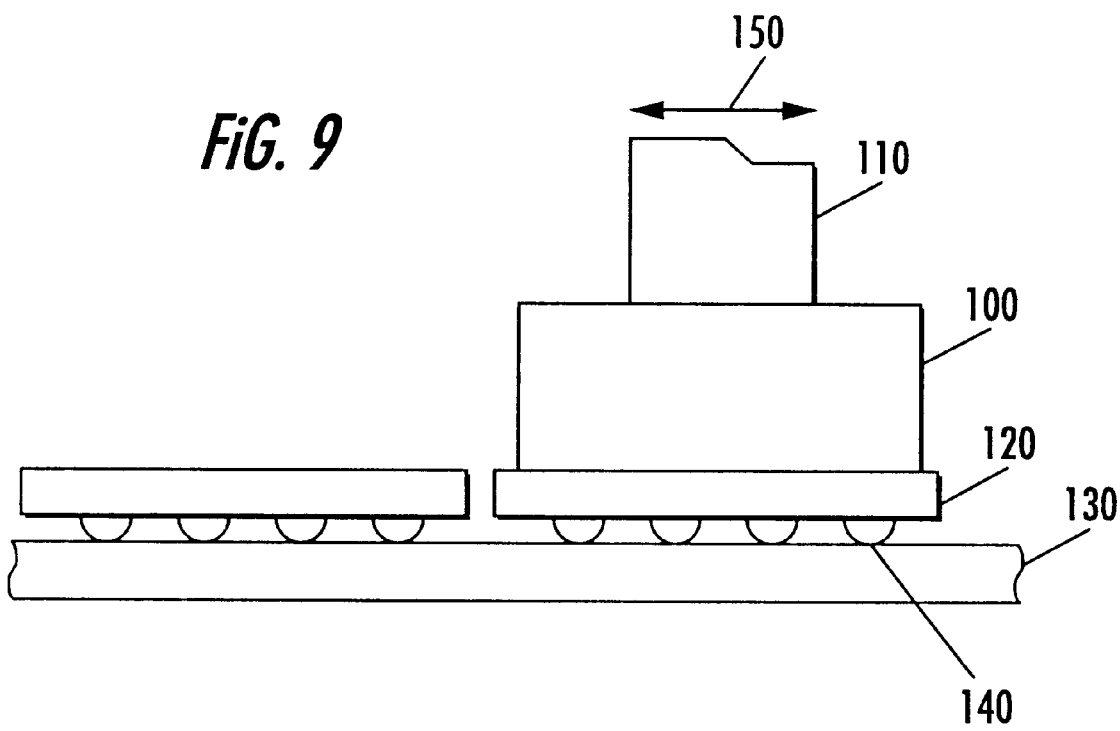

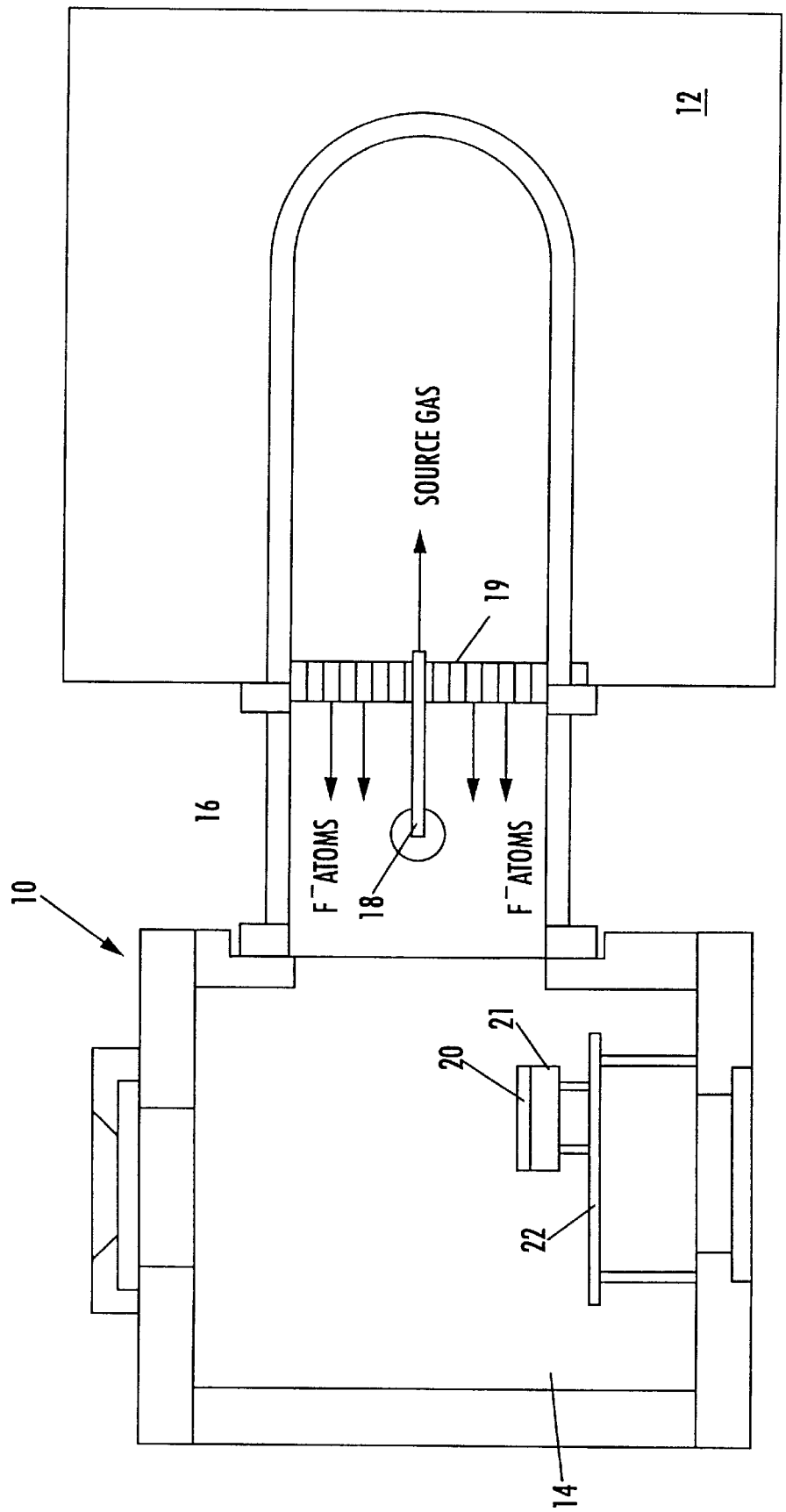

TACKING PROCESSES AND SYSTEMS FOR SOLDERING

FIELD OF THE INVENTION

This invention relates to microelectronic assembly processes and systems, and more particularly to soldering processes and systems.

BACKGROUND OF THE INVENTION

Soldering is widely used to join microelectronic assemblies. For example, solder is widely used to join electrical leads on components such as integrated circuits ("chips") to other components such as substrates including printed circuit boards, flat panel displays or the like. As is well known to those having skill in the art, solder is a low melting point alloy, usually of the lead-tin type, which is used to join metals at temperatures of about 350° C. or less.

Presently, most soldering processes require precleaning and deoxidation of surface oxides prior to solder reflow, and also require post-soldering cleaning after solder reflow. The deoxidation step is generally performed with flux materials to prepare the surfaces for soldering by removing contaminants and metal oxide from the solder surface and/or the surfaces to be joined. After soldering, flux residue remaining from the deoxidation is removed during post-soldering cleaning.

The use of flux is generally undesirable because the flux residue can degrade the components or other materials which come in contact with the flux. Cleaning of the flux can also degrade the components. Moreover, as the circuit density of microelectronic devices has increased, the leads on these devices have become smaller and more closely spaced. Thus, flux has become more difficult to remove after soldering. Finally, with increasing environmental consciousness, the use of CFC-containing cleaning solvents is generally disfavored. Replacement cleaning solvents may add to the cost of the product and/or process.

In a pioneering invention, Dishon and Bobbio described a fluxless soldering process. In this process, fluorine-containing plasma excitation is performed on the solder, so that soldering may be performed without the need for flux and post-soldering cleaning. This pioneering invention is described in U.S. Pat. No. 4,921,157 to Dishon et al., issued May 1, 1990, entitled "Fluxless Soldering Process" and assigned to the assignee of the present invention, the disclosure of which is hereby incorporated herein by reference. Since the time of the Dishon et al. patent, this fluxless soldering process, now commonly referred to as the Plasma Assisted Dry Soldering (PADS) process, has become widely reported and widely used in industry.

See, for example, the publications entitled *"Effect Of Water Vapor and Oxygen on Fluxless Soldering in Air and Nitrogen"* by co-inventor Nangalia et al., First International Flip Chip Symposium, San Jose, Calif., February, 1994; *"Fluxless, No Clean Solder Processing of Components, Printed Wiring Boards, and Packages in Air and Nitrogen"* by co-inventor Koopman et al., Surface Movement International, San Jose, Calif., Aug. 29–31, 1994; *"Fluxless No-Clean Assembly of Solder Bumped Flip Chips"* by coinventor Koopman et al., Electronic Components and Technology Conference, Orlando, Fla., May 28–31, 1996; and *"Solder Flip Chip Developments at MCNC"*, by coinventor Koopman et al., 1996 International Flip Chip, Ball Grid Array, Tab & Advanced Packaging Symposium, Sunnyvale, Calif., Feb. 14–16, 1996, the disclosures of which are hereby incorporated herein by reference.

The Dishon et al. patent exposed the solder to a fluorine-containing plasma. Later, fluxless soldering of copper was performed by exposing a copper surface to be soldered to a fluorine-containing plasma. See U.S. Pat. No. 5,407,121 to coinventor Koopman et al. entitled "Fluxless Soldering of Copper", assigned to the assignee of the present invention. An improved fluxless soldering system is also described in the aforesaid U.S. Pat. No. 5,407,121 and is claimed in U.S. Pat. No. 5,499,754 to Bobbio et al. entitled "Fluxless Soldering Sample Pretreating System", assigned to the assignee of the present invention. As shown, a sample chamber extension extends outwardly from an opening in a sample chamber. A fluorine-containing gas is supplied into the extension. An energy source surrounding the extension produces microwave energy in the extension to produce a plasma. Atomic fluorine traverses from the extension into the chamber so that the sample is exposed to atomic fluorine from the fluorine-containing plasma, downstream of the plasma.

The PADS process has provided breakthrough soldering technology which can eliminate flux and flux cleaning. Nonetheless, the use of flux also had a beneficial aspect with respect to tacking. When flux was used in soldering the flux acted like a glue to "tack" the chip in position during handling and subsequent reflow or soldering. Having no flux to provide the tacking, other sources of tacking may be required to successfully complete a soldering process.

Tacking is also generally required in surface mount technology, because this technology mounts component leads on the surface of a printed circuit board. Accordingly, viscous or tacky fluxes have been used to adhere the component in place prior to soldering. Unfortunately, the component adhesion requirement may place additional requirements on the flux formulation.

Thermocompression has been utilized as an alternate source of tacking. However, this process of tacking generally requires thermocompression times of 30 to 60 seconds. In a manufacturing environment, the tacking times required by thermocompression may reduce the throughput excessively.

SUMMARY OF THE INVENTION

It is therefore an object of the present invention to provide improved tacking processes and systems for fluxless soldering.

It is another object of the present invention to provide improved tacking processes and methods for surface mount soldering.

It is yet another object of the present invention to provide rapid tacking processes and systems for fluxless soldering.

It is still another object of the present invention to provide rapid tacking processes and systems for surface mount soldering.

These and other objects of the present invention are accomplished by using ultrasonic vibration to tack components prior to soldering. In particular, a first component is placed on a second component with solder therebetween. At least one of the first and second components are ultrasonically vibrated to thereby tack the solder to at least one of the first and second components. The solder is then reflowed. Ultrasonic tacking times of less than one second can be used, to provide high throughput. Other application of vibration, such as subsonic vibration, may be applied for times less than one second.

The placing step may be preceded by the step of exposing at least one of the first component, the second component and the solder to a fluorine containing plasma. In an alternative embodiment the reflowing step is preceded by the step of exposing at least one of the first component, the second component and the solder to a fluorine containing plasma. Thus, fluxless solder pretreatment may take place prior to, simultaneous with, or after component tacking.

According to another aspect of the present invention an improved process for fluxless soldering is provided by placing the first component on the second component, ultrasonically vibrating at least one of the first and second components, to thereby tack the first and second components to one another, and soldering the first component to the second component thereafter. In this embodiment, solder is not provided between the components prior to the placing step. Rather, the components are soldered after placement and tacking, for example by using wave soldering.

Soldering systems according the invention include a component placer which places a first component on a second component with solder therebetween. An ultrasonic vibrator ultrasonically vibrates at least one of the placed first and second components, to thereby tack the solder to at least one of the placed first and second components. A heat source reflows the tacked solder to thereby solder the first component to the second component.

The systems also preferably include a pretreater which exposes at least one of the first component, the second component and the solder to a fluorine containing plasma prior to placement of the first component on the second component with solder therebetween. Alternatively, the pretreater exposes at least one of the first component, the second component and the solder to a fluorine containing plasma prior to reflow of the tacked solder. Other fluxless soldering processes may also be used. Flux may also be used.

In a preferred embodiment of the system of the present invention the first component is an integrated circuit chip having an array of solder bumps on its face, and the second component is a chip mounting substrate. The component placer includes a movable chuck which picks the chip and places the chip on the substrate, with the array of solder bumps therebetween. An ultrasonic vibrator is mechanically coupled to the chuck to vibrate the chuck, to thereby tack the solder to at least one of the first and second components by ultrasonically vibrating the chip and the array of solder bumps thereon relative to the substrate. Other vibrators, such as subsonic or sonic vibrators may also be used. It will understood that tacking need not establish reliable electrical and mechanical connections between all of the solder bumps and the substrate. Rather, tacking need only establish a sufficient mechanical connection to hold the chip in place prior to soldering.

According to one embodiment of the system of the present invention the ultrasonic vibrator ultrasonically vibrates at least one of the first and second components for less than one second, to thereby tack the solder to at least one of the first and second components.

In an alternate embodiment of the present invention, tacking is used to tack two components to one another prior to soldering, such as wave soldering. A component placer places a first component on a second component. An ultrasonic vibrator ultrasonically vibrates at least one of the placed first and second components, to thereby tack the first and second components to one another. A soldering tool, such as a wave solderer, solders the first component to the second component. High throughput soldering is thereby provided, without the need for flux or other tacking agents.

BRIEF DESCRIPTION OF THE DRAWINGS

FIG. 9 illustrates a chuck having an ultrasonic vibrator head which ultrasonically vibrates a chip with an array of solder bumps on a substrate to thereby tack the solder to the substrate according to the present invention.

FIG. 10 illustrates a fluorine-containing plasma exposing station which may be used in processes and systems according to the present invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Accordingly, exemplary descriptions of the present invention will be described. As is known to those having skill in the art the present invention is specially useful in soldering an integrated circuit ("chip") to a second component surface; however, the present examples should not be construed as limiting the present invention to a chip soldering application. Moreover, although chips with solder bumps are illustrated, other mounting technologies, such as surface mount technologies, may also be used. It will also be understood that although the present examples illustrate mounting of a single chip on a second surface, typically multiple chips are mounted on a surface and then joined.

The present invention includes processes and systems for soldering a surface of a first component to a surface of a second component with solder therebetween and ultrasonically vibrating the first and/or second components to thereby tack the solder to the first and/or second components prior to reflowing the solder. The first component is placed on the second component with solder therebetween. Then, at least one of the first and second components is ultrasonically vibrated, preferably for less than one second, to thereby tack the solder to at least one of the first and second components. Then, the solder is reflowed.

Figure 1:
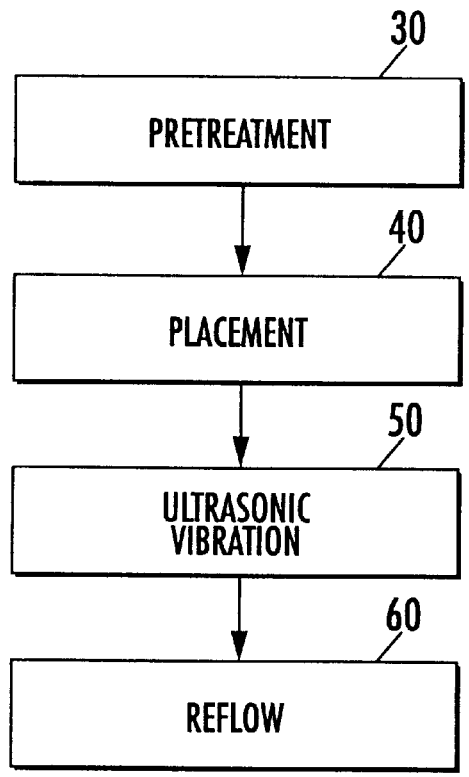
FIG. 1 is a flowchart illustrating a process and system according to the present invention for soldering a first component to a second component utilizing fluxless soldering with pretreatment prior to component placement, tacking by ultrasonic vibration, and reflow.

FIG. 1 shows a flowchart illustrating a first process and system of the present invention. The process includes a plurality of steps and the system includes a plurality of stations. However, it will be understood that steps can be performed simultaneously, and stations may be combined.

Referring to FIG. 1, plasma pretreatment 30 of the first component and/or the second component and the solder therebetween takes place. Plasma pretreatment 30 may include exposing the first component and/or the second component and/or the solder therebetween to a fluorine-containing plasma for a time sufficient so as to convert at least some of the oxide compounds to fluorine-containing compounds to permit subsequent wetting of solder to occur. A process for plasma pretreatment 30 is described in detail in U.S. Pat. Nos. 5,407,121 and 5,499,754 the disclosures of which are hereby incorporated herein by reference. As is known to those having skill in the art other nonfluorine plasma may be used for the purposes of pretreatment 30. It will also be understood that other fluxless soldering processes, which may or may not use pretreatment, may be used. For example, special reflow or soldering ambients, such as hydrogen or forming gas reflow may be used to reduce oxides prior to or during reflow. As another example, acetic acid vapors and plasma-activated hydrogen gas may also be used.

Following plasma pretreatment 30 the placement 40 of the first component on the second component with solder therebetween occurs. To tack the first component over the second component the first and/or second component is ultrasonically vibrated at Block 50. Tacking ensures that the chip remains in position prior to reflow 60. Ultrasonic vibration 50 provides the tacking by creating a "friction weld." Other friction welders which are capable of welding sufficiently to tack in less than one second may also be used. For example, sonic or subsonic vibrators may be used. It is noted that after ultrasonic vibration 50 it is not necessary for all the contacts on the first component to be connected to the contacts in the second component but rather that proper positioning is maintained by the tacking.

According to the present invention, the ultrasonic vibration 50 is preferably maintained for a period under one second. It is noted that ultrasonic vibration 50 may be applied for over one second to perform the tacking. However, a period under one second is advantageous because it increases throughput.

It will be understood that the process variables associated with ultrasonic vibrating will generally depend upon the size of the components, the number of contacts, the metallurgy, and other parameters. Process variables such as ultrasonic amplitude, frequency, direction, duration and parts temperature, should be optimized for the particular components and process which is involved.

After the tacking has been completed, the solder between the first component and the second component is reflowed at Block 60. During reflow 60 the solder between the first component and the second component is heated to a temperature beyond its melting point, usually about 350C° or less. Once the solder is heated it will reflow to electrically and mechanically bond the first component and the second component. It will be understood that an appropriate reflow ambient, such as air, nitrogen, reducing gases, vacuum, etc. may be used. Solder reflowing steps and stations are well known to those having skill in the art and need not be described further herein.

Figure 2:
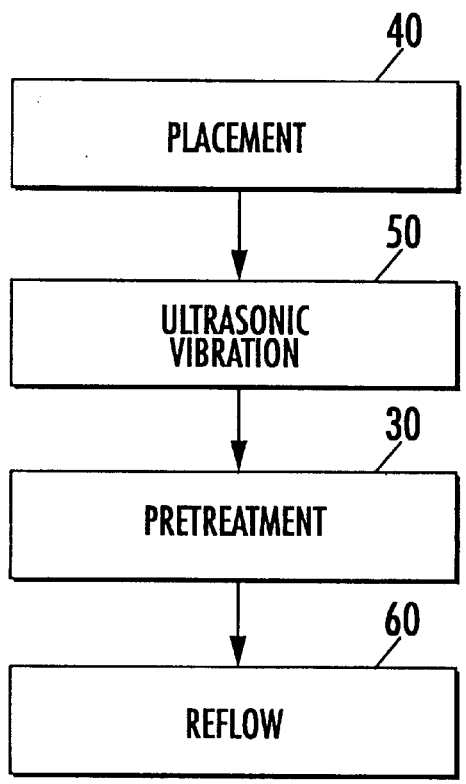
FIG. 2 is a flowchart illustrating a process and system according to the present invention for soldering a first component to a second component utilizing fluxless soldering with pretreatment prior to reflow, tacking by ultrasonic vibration, and reflow.

The present invention can alter the steps/stations which were previously described. FIG. 2 shows a flowchart illustrating alternate steps/stations according to the present invention. As shown in FIG. 2, pretreatment 30 of the first component and/or the second component and the solder therebetween occurs after ultrasonic vibration 50 and prior to reflow 60. According to this embodiment of the present invention the placement 40 of the first component on the second component with solder therebetween occurs first. Next, to tack the first component over the second component the first and/or second component goes through a step of ultrasonic vibration 50. Following tacking by ultrasonic vibration 50 plasma pretreatment 30 of the first component and/or the second component and the solder therebetween takes place. Pretreatment 30 is followed by reflow 60. During reflow 60 the solder between the first component and second component reflows to the wettable portions of the first component and the second component.

Figure 3:
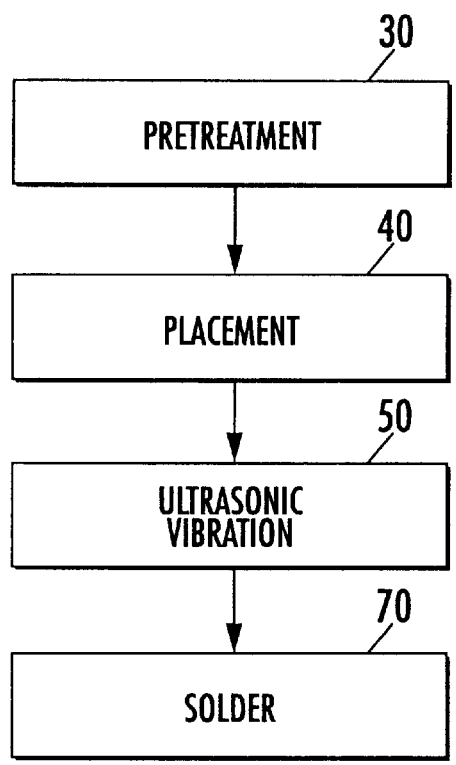
FIG. 3 is a flowchart illustrating a process and system according to the present invention for soldering a first component to a second component utilizing fluxless soldering with pretreatment prior to component placement and tacking by ultrasonic vibration.

The present invention also includes soldering not involving reflow 50, such as wave soldering. FIG. 3 shows a flowchart illustrating the steps/stations for the present invention applicable to soldering. The first step/station is for plasma pretreatment 30 of the first component and/or the second component, for removal of contaminants and metal oxides from the surfaces. After plasma pretreatment 30 the placement 40 of the first component on the second component occurs. Unlike FIG. 1 and FIG. 2, solder is not present between the first component and the second component. To tack the first component over the second component the first and/or second component goes through ultrasonic vibration 50. Tacking ensures that the component remains in position prior to soldering at Block 70.

According to a preferred embodiment of the present invention, the ultrasonic vibration 50 is maintained for a period less than one second. After tacking by ultrasonic vibration 50 has been completed, the first component and the second component go through a solder step/station 70, where solder is applied to the first component and the second component. The tacking achieved after ultrasonic vibration 50 will maintain the first component in proper position in relation to the second component during handling prior to and during solder 70. As is known to those having skill in the art, the solder step/station 70 can be performed by various techniques such as wave soldering.

Figure 4:
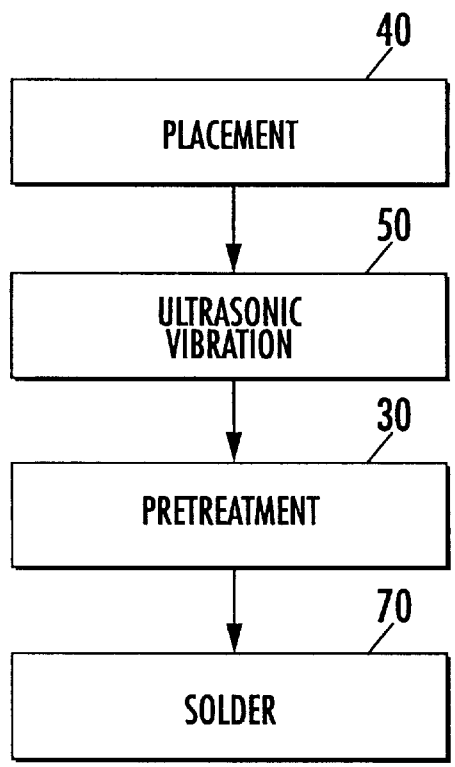
FIG. 4 is a flowchart illustrating a process and system according to the present invention for soldering a first component to a second component utilizing fluxless soldering with pretreatment prior to soldering and tacking by ultrasonic vibration.

FIG. 4 illustrates a variation in the steps/stations of FIG. 3 to solder a first component to a second component according to the present. invention. According to FIG. 4, placement 40 of the first component on the second component occurs first. Next, to tack the first component over the second component the first and/or second component is ultrasonically vibrated at 50. Following tacking by ultrasonic vibration 50, plasma pretreatment 30 of the first component and/or second component, and/or of the solder occurs. After pretreatment 30, the first component and second component go through the solder step/station 70.

Figure 5:
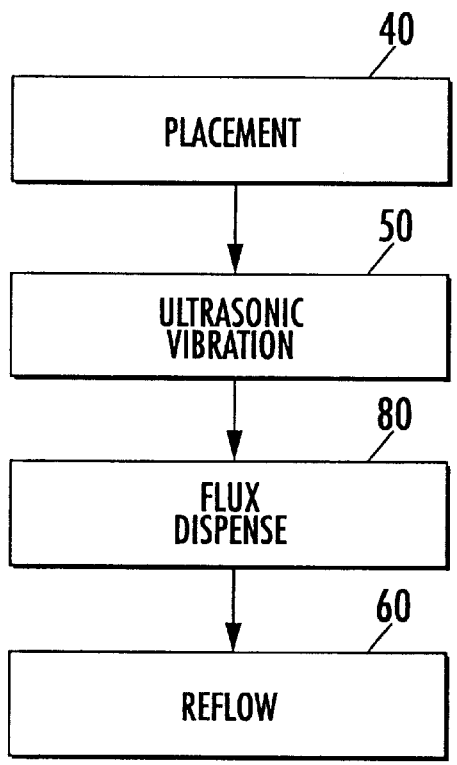
FIG. 5 is a flowchart illustrating a process and system according to the present invention for soldering a first component to a second component using flux and tacking by ultrasonic vibration.

FIG. 5 illustrates another process and system of the present invention. In FIG. 5, ultrasonic tacking is used in combination with flux. Thus, as illustrated in FIG. 5, after placement 40 and ultrasonic vibration 50, flux is dispensed at step/station 80. It will be understood that since the flux need not also perform a tacking function, the requirements on the flux may be relaxed. For example, requirements on viscosity and/or tackiness may be relaxed. Fluxes which can flow more readily, have fewer solids and/or leave fewer residues which are more readily cleaned, may be used. After flux dispense 80, reflow 60 or soldering 70 (not illustrated in FIG. 5) may be performed. Flux cleaning is then also preferably performed.

Figure 6:
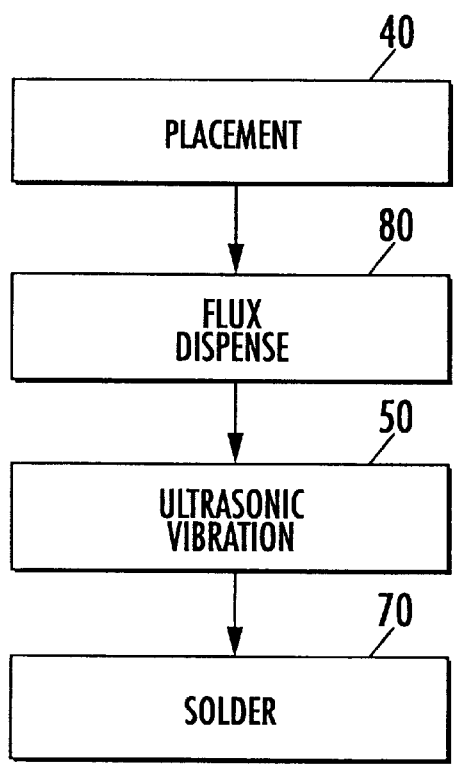
FIG. 6 is a flowchart illustrating a second process and system according to the present invention for soldering a first component to a second component using flux and tacking by ultrasonic vibration.

FIG. 6 illustrates yet another process and system of the present invention including flux. In contrast to FIG. 5, flux dispense 80 occurs prior to ultrasonic vibration 50. A solder step/station 70 rather than a reflow step/station 60 is also illustrated.

Figure 7:
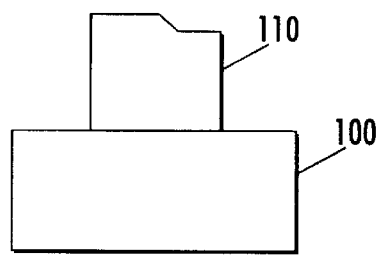
FIG. 7 illustrates a chuck having an ultrasonic vibrator head for picking-up a first component to be soldered to a second component according to the present invention.

FIG. 7 schematically illustrates a chuck 100 for picking-up and placing a first component to be soldered to a second component, to thereby combine the placement step/station 40 and the ultrasonic vibration step/station 50. Chuck 100 includes an ultrasonic vibrator head 110. The ultrasonic vibrator head 110 can be a separate attachment added to an existing chuck 100.

Figure 8A:
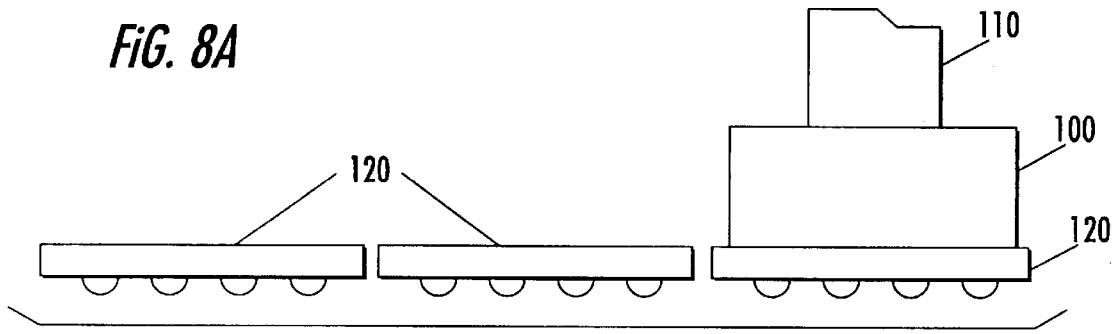
FIG. 8A illustrates a chuck having an ultrasonic vibrator head picking-up a chip with an array of solder bumps from a bin with multiple chips according to the present invention.
Figure 8B:
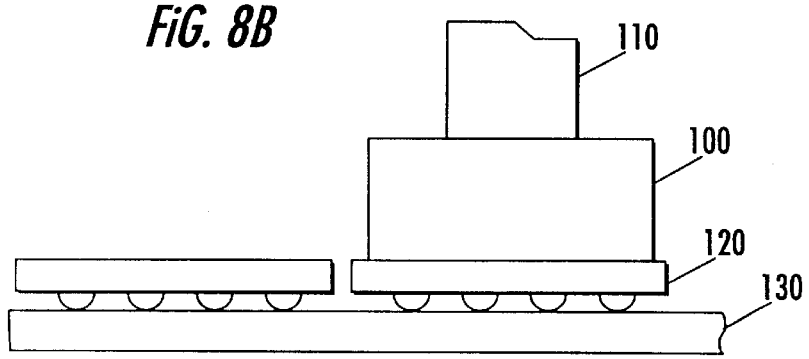
FIG. 8B illustrates a chuck having an ultrasonic vibrator head placing a chip with an array of solder bumps on a substrate according to the present invention.

According to the embodiment illustrated in FIG. 8A the chuck 100 having an ultrasonic vibrator head 110, picks an integrated circuit ("chip") 120 from a bin containing multiple chips 120. In the present example the chip 120 shown is a so-called bumped flip-chip with bumps ready for reflow 60 to the connecting component. As illustrated in FIG. 8B, a system according to the present invention places the chip 120 on a substrate 130 properly positioned so as to contact appropriate leads or pads (not shown) on the substrate 130. Multiple chips 120 may be placed serially or simultaneously.

The ultrasonic vibrator head 110 vibrates for a period under one second, preferably in the direction shown by arrow 150, to thereby tack the chip 120 to the substrate as illustrated in FIG. 9. It will be understood that the direction of vibration may also include vertical as well as horizontal harmonics. Vibration frequency, amplitude and time may be adjusted to provide tacking at high throughput, without damaging components 120 or 130, or solder bumps 140. The ultrasonic vibrator head 110 causes the chuck 100 and consequently the chip 120 to also ultrasonically vibrate on the substrate 130, to thereby tack the chip 100 on the substrate 130. Tacking ensures that correct positioning exists between the bumps 140 on the chip 120 and the substrate 130 prior to reflow 60 during component handling.

Systems and processes according to the present invention can also include fluxless pretreatment 30 of the first and/or second component, and/or of the solder. FIG. 10 illustrates a preferred embodiment of a pretreater wherein the first surface, the second surface and/or the solder are fluxlessly pretreated to thereby improve solder wettability. According to the embodiment described, the pretreater is a fluorine-containing plasma exposing station described in detail in U.S. Pat. Nos. 5,407,121 and 5,499,754, the disclosures of which are hereby incorporated herein by reference. FIG. 10 is a reproduction of FIG. 1 of the aforementioned patents.

FIG. 10 schematically illustrates a side view of a plasma exposing apparatus 10 according to the present invention. As illustrated, apparatus 10 includes a plasma energy generating chamber 12, a sample treatment chamber 14, and a passageway 16 connecting chambers 12 and 14.

A fluorine-containing gas, such as $SF_6$, $CF_4$ and the like, is provided from gas supply line 18 into the plasma energy generating chamber 12. Here, energy is generated sufficient to disassociate the fluorine-containing gas to form atomic fluorine. The plasma energy may be generated using any of the techniques known in the art for creating a fluorine-containing plasma. In one advantageous embodiment, the plasma generating energy is provided from a microwave source, such as a microwave oven.

The disassociated fluorine atoms diffuse from the plasma energy generating chamber 12 through passageway 16 and into the sample reaction chamber 14. Preferably, a perforated aluminum plate 19 is provided between plasma energy generating chamber 12 and passageway 16. The aluminum plate contains the active plasma generation to within chamber 12, so that the samples are not exposed to the plasma generating energies or temperatures. This also allows free flow of gases, so that fluorine atoms can enter the sample chamber and react with the surface oxides on the sample. In addition, aluminum reacts very slowly with fluorine and passivates so that fluorine atom concentration in the sample chamber 14 is maximized and very little fluorine is absorbed by the aluminum.

A sample which is to be exposed to the fluorine-containing gases is provided within sample chamber 14. As illustrated, the sample can be, for example, a first component 20 having a first surface, provided on a second component 21 having a second surface, with solder therebetween (not shown). As is known to those having skill in the art, the first surface, second surface and/or solder may include oxide compounds. Advantageously, the sample is placed on a sample stage 22, which can be thermally coupled to a heating means (not shown) for selectively adjusting the temperature of the stage, and thus the sample, prior to and during the pretreatment step.

The sample is pretreated by exposing the sample to the gases from the fluorine-containing plasma. The plasma pretreating process conditions are selected to provide the desired degree of exposure to fluorine atoms. Advantageously, conditions are selected so that the sample is exposed to fluorine atoms for a time sufficient so as to convert at least some of the oxide compounds to fluorine-containing compounds, to permit subsequent wetting of solder to occur.

The exposing apparatus 10 may also be an Integrated Electronic Innovations (IEI) Phase 2 PADS Tool which is described in the above-cited Koopman et al. publications, and which includes two plasma energy generating chambers.

EXAMPLE

The following example is provided to illustrate tacking processes and systems for soldering according to the present invention, but is not to be construed as a limitation on the invention.

Integrated circuit chips including fourteen solder bumps of 90/10 Pb/Sn solder composition were tacked to a Kovar substrate with 0.75 $\mu$m of Ni and 2 $\mu$m of Au. For conventional pressure tacking, the integrated circuit chips were placed on the upper stage of a flip chip aligner bonder, and the substrate was put on the lower stage. The bonder was programmed to apply a preset load of 200 gm for 45 seconds. These parts were then placed in a ball shear tester to measure the tacking force. For ultrasonic tacking according to the invention, the chips were placed on the upper stage of the flip chip aligner bonder, and the substrate was put in the lower stage. The bonder was programmed to apply a preset load of 200 gm for 2 seconds. Once the bonder reached the desired load, five pulses of ultrasonic energy were applied, with each pulse lasting approximately 0.1 second, for a total of 0.5 second application of ultrasonic energy.

The following Table illustrates the results of the experiment:

TABLE

|  | Ultrasonic Tack | Pressure Tack |
|---|---|---|
| Application Time | 0.5 sec | 45 sec |
| Tacked Strength | 17 gm | 0.5 gm |

As shown in the Table, ultrasonic tacking provides a shear force of 17 gm while pressure tracking only gives a shear force of 0.5 gram. Moreover, the throughput is almost an order of magnitude faster.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A process of soldering a first component to a second component, comprising the steps of:
   placing the first component on the second component;
   vibrating at least one of the first and second components, to thereby tack the first and second components to one another; and
   reflowing the solder;
   wherein said vibrating step comprises the step of vibrating at least one of the first and second components for less than one second, to thereby tack the first and second components to one another.

2. A process of soldering a first component to a second component, comprising the steps of:
   placing the first component on the second component;
   vibrating at least one of the first and second components, to thereby tack the first and second components to one another; and
   reflowing the solder;
   wherein said steps of placing and vibrating are repeatedly performed on a plurality of first components, prior to performing said soldering step.

3. A system for soldering a first component to a second component, comprising:
   a component placer which places the first component on the second component with solder therebetween;
   a vibrator, which vibrates at least one of the placed first and second components, to thereby tack the solder to at least one of the placed first and second components;
   a heat source which reflows the tacked solder to thereby solder the first component to the second component; and
   wherein said vibrator comprises an ability to vibrate at least one of the first and second components for less than one second and thereby tack the solder to at least one of the first and second components.

4. A system for soldering a first component to a second component, comprising:

a component placer which places the first component on the second component;
a vibrator, which vibrates at least one of the placed first and second components, to thereby tack the first and second components to one another; and
a soldering tool, which solders the first component to the second component;
wherein said vibrator comprises an ability to vibrate at least one of the first and second components for less than one second and thereby tack the first and second components to one another.

5. A process of soldering a first component to a second component, comprising the steps of:
   placing the first component on the second component with solder therebetween;
   ultrasonically vibrating at least one of the first and second components, to thereby tack the solder to at least one of the first and second components; and
   reflowing the solder;
   wherein said ultrasonically vibrating step comprises the step of ultrasonically vibrating at least one of the first and second components for less than one second, to thereby tack the solder to at least one of the first and second components.

6. A process of soldering a first component to a second component, comprising the steps of:
   placing the first component on the second component with solder therebetween;
   ultrasonically vibrating at least one of the first and second components, to thereby tack the solder to at least one of the first and second components; and
   reflowing the solder;
   wherein said steps of placing and ultrasonically vibrating are repeatedly performed on a plurality of first components, prior to performing said reflowing step.

7. A process of soldering a first component to a second component, comprising the steps of:
   placing the first component on the second component;
   ultrasonically vibrating at least one of the first and second components, to thereby tack the first and second components to one another; and
   reflowing the solder;
   wherein said ultrasonically vibrating step comprises the step of ultrasonically vibrating at least one of the first and second components for less than one second, to thereby tack the first and second components to one another.

8. A process of soldering a first component to a second component, comprising the steps of:
   placing the first component on the second component;
   ultrasonically vibrating at least one of the first and second components, to thereby tack the first and second components to one another; and
   reflowing the solder;
   wherein said steps of placing and ultrasonically vibrating are repeatedly performed on a plurality of first components, prior to performing said soldering step.

9. A system for soldering a first component to a second component, comprising:
   a component placer which places the first component on the second component with solder therebetween;
   an ultrasonic vibrator, which vibrates ultrasonically at least one of the placed first and second components, to thereby tack the solder to at least one of the placed first and second components;

a heat source which reflows the tacked solder to thereby solder the first component to the second component; and wherein said ultrasonic vibrator comprises an ability to ultrasonically vibrate at least one of the first and second components for less than one second and thereby tack the solder to at least one of the first and second components.

10. A system for soldering a first component to a second component, comprising:

a component placer which places the first component on the second component;

an ultrasonic vibrator, which ultrasonically vibrates at least one of the placed first and second components, to thereby tack the first and second components to one another; and a soldering tool, which solders the first component to the second component;

wherein said ultrasonic vibrator comprises an ability to ultrasonically vibrate at least one of the first and second components for less than one second and thereby tack the first and second components to one another.

11. A process of soldering a first component to a second component comprising the steps of:

placing the first component on the second component with solder therebetween;

vibrating at least one of the first and second components, to thereby tack the solder to at least one of the first and second components; and reflowing the solder;

wherein said steps of placing and vibrating are repeatedly performed on a plurality of first components, prior to performing said reflowing step.

12. A process of soldering a first component to a second component, comprising the steps of:

placing the first component on the second component with solder therebetween;

exposing at least one of the first component, the second component and the solder to a fluorine containing plasma;

vibrating at least one of the first and second components, to thereby tack the solder to at least one of the first and second components; and reflowing the solder;

wherein said first component is an integrated circuit chip having an array of solder bumps on a face thereof, and wherein said second component is a chip mounting substrate;

wherein said placing step comprises the steps of:
picking the chip with a chuck, and
moving the chuck to place the chip on the substrate, with the array of solder bumps therebetween;

wherein said vibrating step comprises the step of vibrating the chuck, to thereby vibrate the chip and the array of solder bumps thereon, relative to the substrate.

13. A process according to claim 12 wherein said reflowing step comprises the step of soldering the first component to the second component.

14. A process according to claim 12 wherein said vibrating step comprises the step of ultrasonically vibrating at least one of the first and second components.

15. A process according to claim 12 wherein said placing step is preceded by the exposing step.

16. A process according to claim 12 wherein said reflowing step is preceded by the exposing step.

17. A process according to claim 12 wherein said reflowing step comprises the step of fluxlessly reflowing the solder.

18. A process according to claim 12 wherein said reflowing step is preceded by the step of fluxlessly pretreating at least one of the first component, the second component and the solder, to thereby improve solder wettability to at least one of the first and second components.

19. A process according to claim 12 wherein said reflowing step is preceded by the step of applying flux to at least one of the first component, the second component and the solder.

20. A system for soldering a first component to a second component, comprising:

a component placer which places the first component on the second component with solder therebetween;

a pretreater which exposes at least one of the first component, the second component and the solder to a fluorine containing plasma;

a vibrator, which vibrates at least one of the placed first and second components, to thereby tack the solder to at least one of the placed first and second components; and a heat source which reflows the tacked solder to thereby solder the first component to the second component;

wherein said first component is an integrated circuit chip having an array of solder bumps on a face thereof, and wherein said second component is a chip mounting substrate;

wherein said component placer comprises a movable chuck which picks the chip and places the chip on the substrate, with the array of solder bumps therebetween; and wherein said vibrator is mechanically coupled to said chuck, to vibrate the chuck, to thereby vibrate the chip and the array of solder bumps thereon, relative to the substrate.

21. A system according to claim 20 wherein said heat source comprises a solder tool, which solders a first component to the second component.

22. A system according to claim 20 wherein said vibrator ultrasonically vibrates at least one of said first and second component.

23. A system according to claim 20 wherein said pretreater exposes at least one of the first component, the second component and the solder to a fluorine containing plasma prior to placement of the first component on the second component with solder therebetween.

24. A system according to claim 20 wherein said pretreater exposes at least one of the first component, the second component and the solder to a fluorine containing plasma prior to reflow of the tacked.

25. A system according to claim 20 further comprising a fluxless treater which fluxlessly treats at least one of the first component, the second component and the solder, to thereby improve solder wettability to at least one of the first and second components.

26. A system according to claim 20 further comprising a fluxless pretreater which fluxlessly pretreats at least one of the first component, the second component and the solder prior to reflow of the tacked solder, to thereby improve solder wettability to at least one of the first and second components.

27. A system according to claim 20 further comprising a flux dispenser which dispenses flux onto at least one of the first component, the second component and the solder prior to reflow of the tacked solder.

* * * * *

UNITED STATES PATENT AND TRADEMARK OFFICE
CERTIFICATE OF CORRECTION

PATENT NO. : 5,992,729

DATED : November 30, 1999

INVENTOR(S) : Koopman et al.

It is certified that error appears in the above-identified patent and that said Letters Patent is hereby corrected as shown below:

Column 6, line 9, after "less." insert --One possible heat source could be a solder tool, but other suitable heat sources could also be used.--.

Column 9, line 32, after "second component" insert --with solder therebetween--; line 43, after "second component" insert --with solder therebetween--.

Column 10, line 40, after "second component" insert --with solder therebetween--; line 53, after "second component" insert --with solder therebetween--.

Signed and Sealed this

Fourth Day of July, 2000

*Attest:*

Q. TODD DICKINSON

*Attesting Officer*  *Director of Patents and Trademarks*